United States Patent

Mason et al.

Patent Number: 5,732,407
Date of Patent: Mar. 24, 1998

[54] CONFIGURABLE RANDOM ACCESS MEMORY FOR PROGRAMMABLE LOGIC DEVICES

[75] Inventors: William R. Mason; Rodney H. Orgill; Andrew J. Blasciak, all of Colorado Springs, Colo.

[73] Assignee: Hewlett-Packard Co., Palo Alto, Calif.

[21] Appl. No.: 570,033

[22] Filed: Dec. 11, 1995

[51] Int. Cl.[6] .................................................. G06F 12/00
[52] U.S. Cl. .......................... 711/104; 711/105; 711/170; 711/211; 364/DIG. 1
[58] Field of Search ................. 326/41, 39; 307/468; 364/200; 395/402, 431, 432; 711/104, 105

[56] References Cited

U.S. PATENT DOCUMENTS

| 4,449,207 | 5/1984 | Kung et al. | 365/230.02 |
| 4,617,624 | 10/1986 | Goodman | 364/200 |
| 4,623,990 | 11/1986 | Allen et al. | 365/189.06 |
| 4,716,544 | 12/1987 | Bartley | 395/515 |
| 4,972,105 | 11/1990 | Burton et al. | 307/468 |
| 5,426,378 | 6/1995 | Ong | 326/39 |
| 5,572,148 | 11/1996 | Lythe et al. | 326/41 |

*Primary Examiner*—Frank J. Asta
*Assistant Examiner*—Fred F. Tzeng

[57] ABSTRACT

A programmable logic device having a configurable random access memory (RAM) integrated on a single integrated circuit chip. The configurable RAM has a user selectable logical configuration. In operation, the RAM in accordance with the present invention is addressed by a system address bus and data is provided using a system data bus. The memory array can also be addressed by a control address bus and data read out and loaded into the RAM using a control data bus.

12 Claims, 5 Drawing Sheets

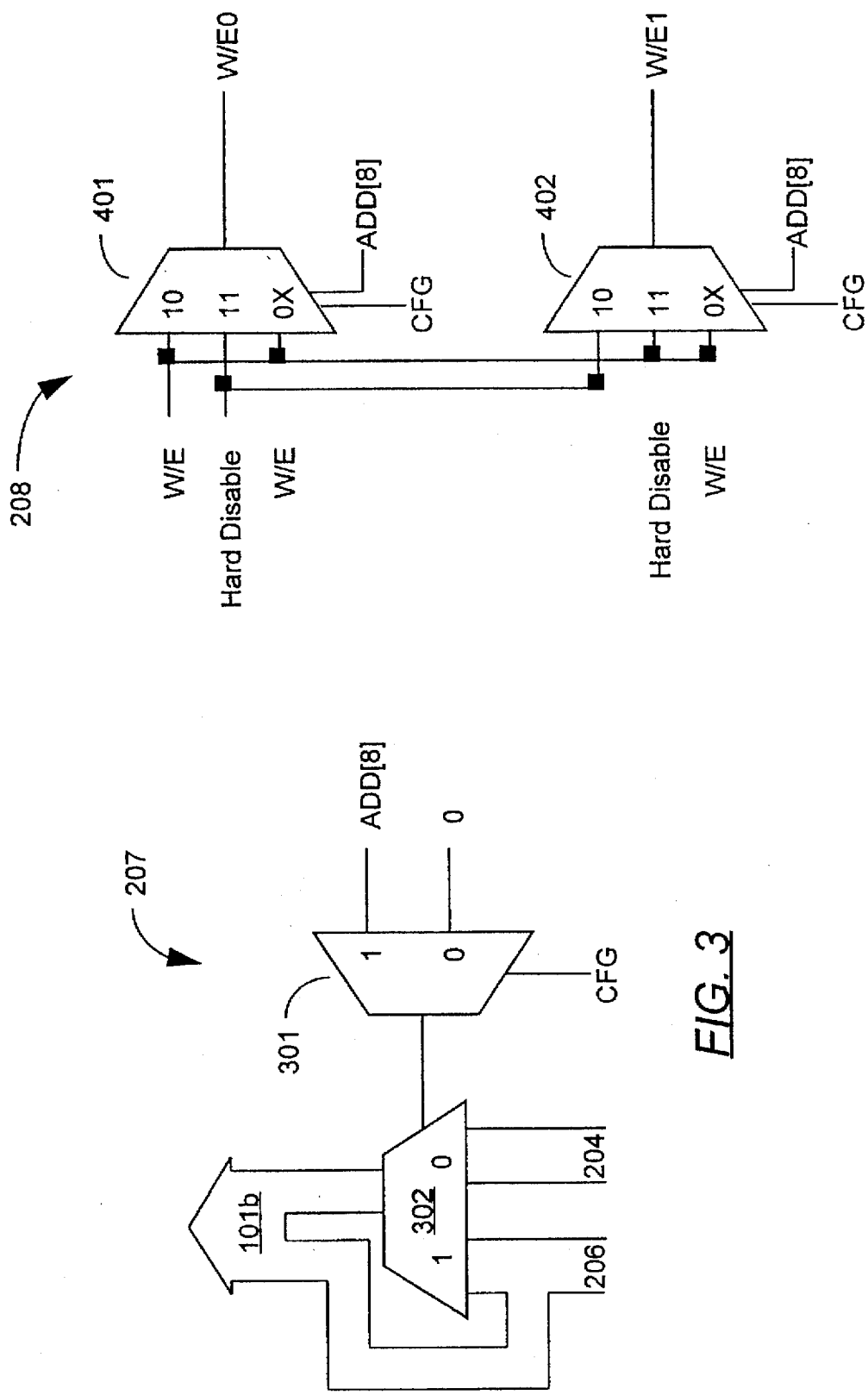

CONFIGURABLE RANDOM ACCESS MEMORY FOR PROGRAMMABLE LOGIC DEVICES

BACKGROUND OF THE INVENTION

1. Field of the Invention

The present invention relates, in general, to, storage elements in programmable logic devices (PLDs) and, more particularly, to a configurable random access memory block for field programmable logic devices (FPGAs).

2. Statement of the Problem

Programmable logic devices (PLDs) such as programmable logic arrays (PLAs), and field programmable gate arrays (FPGAs) are well known. A trend in the programmable logic device industry is to increase functionality and programmability in the programmable logic device. Programmable logic devices comprise an array of programmable logic elements which include circuitry for implementing a desired logic function together with a means for programmably interconnecting the many programmable elements on the PLD chip. In operation, a user programs the circuitry and interconnects to perform a desired function.

A common function desired by many circuit designers is some type of storage or memory to use as addressable registers, temporary data storage, and the like. Conventional PLDs require the memory to be provided external to the chip. This requires that the user dedicate valuable input output pins to support communication between the PLD and the external memory chip. External memory does offer an advantage, however, in that the memory chip can be selected to have a configuration meeting the precise needs of the user.

Alternatively, the memory elements can be implemented in the programmable logic device itself. This is done by programming some of the logic in some of the programmable elements to perform the simple storage function. This option avoids use of external I/O pins, however, it wastes valuable resources within the PLD. Each programmable element requires much more physical space than a typical memory cell and so the space used to implement a storage cell is largely wasted. Because it is desirable to reserve the programmable elements for implementing programmable combinatorial functions, designers avoid implementing storage within the programmable logic device itself.

Another problem with implementing storage or memory in a PLD is that the organization of the storage devices needs to be particularly adapted to the users application. Storage elements such as random access memory (RAM) are typically organized in a physical array of row and columns. Logically, however, the RAM array can be organized to access either a single bit at a time or to access several locations in memory simultaneously with a single address to provide compatibility with multi-bit parallel busses. For example, when a circuit uses eight-bit data words it is advantageous to transport data on an eight-bit bus to perform memory operations eight bits at a time. In this case, it is desirable to access eight locations in memory with each address to speed memory access and simplify circuit design. Of course, more data lines are required to couple the memory array to the data bus. However, fewer address lines are needed. In order to efficiently use RAM incorporated with a programmable logic device it is desirable to configure the RAM to have a logical organization that matches the needs of a particular design.

As programmable logic devices become more complex, evaluating designs that are implemented in the programmable logic device becomes more difficult. It is often desirable during evaluation to halt processing (i.e., stop the system clock) in a particular state. While the programmable logic device is halted, internal nodes are probed or tested to determine their logical state. For example, it may be desirable to read out the contents of RAM. However, in order to preserve the fixed state of the circuit in a halted condition, the system address and data busses cannot be used to read out the contents of the RAM. Further, the programmable logic device can be programmed to load values on internal nodes into memory for evaluation of these internal nodes in addition to evaluating the contents of the RAM. Hence, what is needed is an apparatus and method for reading data from a random access memory without disturbing system resources such as data and address lines.

SUMMARY OF THE INVENTION

Briefly stated, the above identified problems are solved by a programmable logic device, preferably an FPGA, having a configurable random access memory (RAM) integrated on a single integrated circuit chip. The configurable RAM has a user selectable logical configuration. In operation, the RAM in accordance with the present invention is addressed by a system address bus and data is provided using a system data bus. The memory array can also be addressed by a control address bus and data read out and loaded into the RAM using a control data bus.

Preferably, the control address bus is implemented as a serial shift register for accepting a serial data stream containing a desired address. A plurality of address lines extend from the serial address register to activate selected portions of the memory array without disturbing the system address bus. Also, the preferred control data bus is implemented as a serial shift register having a plurality of data lines coupled to receive data from all memory cells addressed by the control address register. Once loaded, the serial data register loads data onto a serial data line for analysis by external circuitry without disturbing the condition of the system data lines.

BRIEF DESCRIPTION OF THE DRAWING

FIG. 3 shows detail of a multiplexor shown in FIG. 2;

FIG. 4 shows detail of a write enable logic block shown in FIG. 2;

DETAILED DESCRIPTION OF THE DRAWING

1. Overview.

Figure 1:
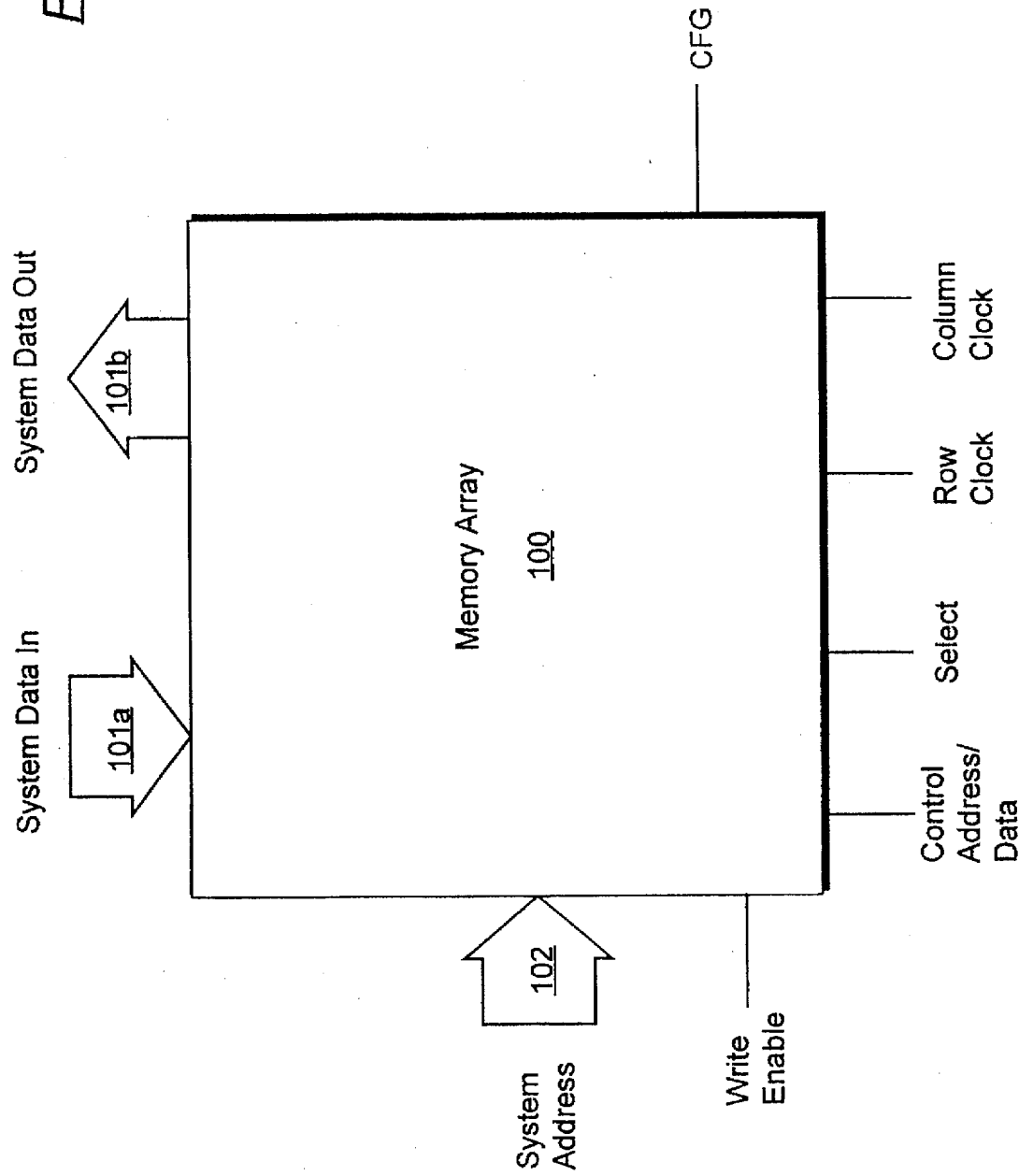
FIG. 1 illustrates a configurable memory array in accordance with the present invention.

FIG. 1 illustrates a configurable memory array 100 in accordance with the present invention. Memory array 100 comprises an array of storage elements (not shown) such as random access memory cells (either dynamic or static), EPROM or EEPROM. The storage elements in memory array 100 are preferably arranged in a physical row and column arrangement. The number of columns in memory array 100 is preferably at least as large as the number of bits in the largest word intended to be used with memory array 100.

System data in bus 101a is a multi-line data bus for carrying data into memory array 100. System data Out bus 101b is a multi-line data bus carrying data from memory array 100. A bi-directional bus may be used as an equivalent of data in bus 101a and data out bus 101b. Preferably, system data in bus 101a and data out bus 101b have at least as many lines as the largest word that memory array 100 will be configured to process. For example, if memory array 100 can be configured as a 512×9 or a 256×18 array, system data bus 101 would have at least 18 lines to handle the 256×18 implementation.

System address bus 102 comprises a multi line address bus in a preferred embodiment. System address bus 102 may comprise separate lines for carrying write address and read address information, or both write and read address information may be multiplexed on a single set of system address lines 102. System address 102 must have at least enough lines to address the number of rows in a logical configuration having the largest number of rows. For example, in the previous example where memory array 100 can be logically configured as either a 512×9 or a 256×18 array, system address bus 102 should have at least enough address lines to handle the logical configuration having 512 rows (i.e., 9 address lines will provide $2^9$=512 unique addresses).

Memory array 100 also receives a write enable (W/E) line which will allow system data from system data in bus 101a to be transferred to selected cells in memory array 100 that are addressed by system address bus 102.

One or more configuration bits indicated by the CFG line in FIG. 1 allow a user to select a logical configuration of memory array 100.

A number of control lines including control address/data lines, select line, row clock, and column clock are used as a second means of addressing and loading data into and reading data from memory array 100 without disturbing system data bus 101a–101b or system address bus 102. These control functions form a control bus that is preferably configured as four wires using a single serial/data line (shown in FIG. 5) to minimize the physical space required by the control bus.

While the preferred embodiment will be described in terms of a static random access memory it should be understood that any storage technology may make use of the present invention including dynamic RAM, EPROM, and the like. Preferably, CMOS technology is used to form memory array 100, but any semiconductor technology can be suitably adapted. The present invention will be described in terms of specific array sizes, logical configuration options, and specific bus widths for system data bus 101a–101b and system address bus 102. However, it should be understood that the specific details described in the preferred embodiment can easily be altered by those of ordinary skill to form configurable memory array 100 to meet the needs of a particular application. These and other modifications that would be apparent to those of skill in the art are equivalent to the specific embodiments disclosed and are considered within the spirit and scope of the claims of the present invention.

2. Alterable logical configuration

Memory array 100 has a physical configuration in which the memory cells are arranged in a number of rows and columns. In addition to the physical array configuration, memory array 100 has a logical array configuration which may or may not be identical to the physical array configuration. It is preferable that at least one logical configuration is identical to the physical configuration in order to ease design and circuit layout. However, this is not a requirement in accordance with the present invention.

Figure 2:
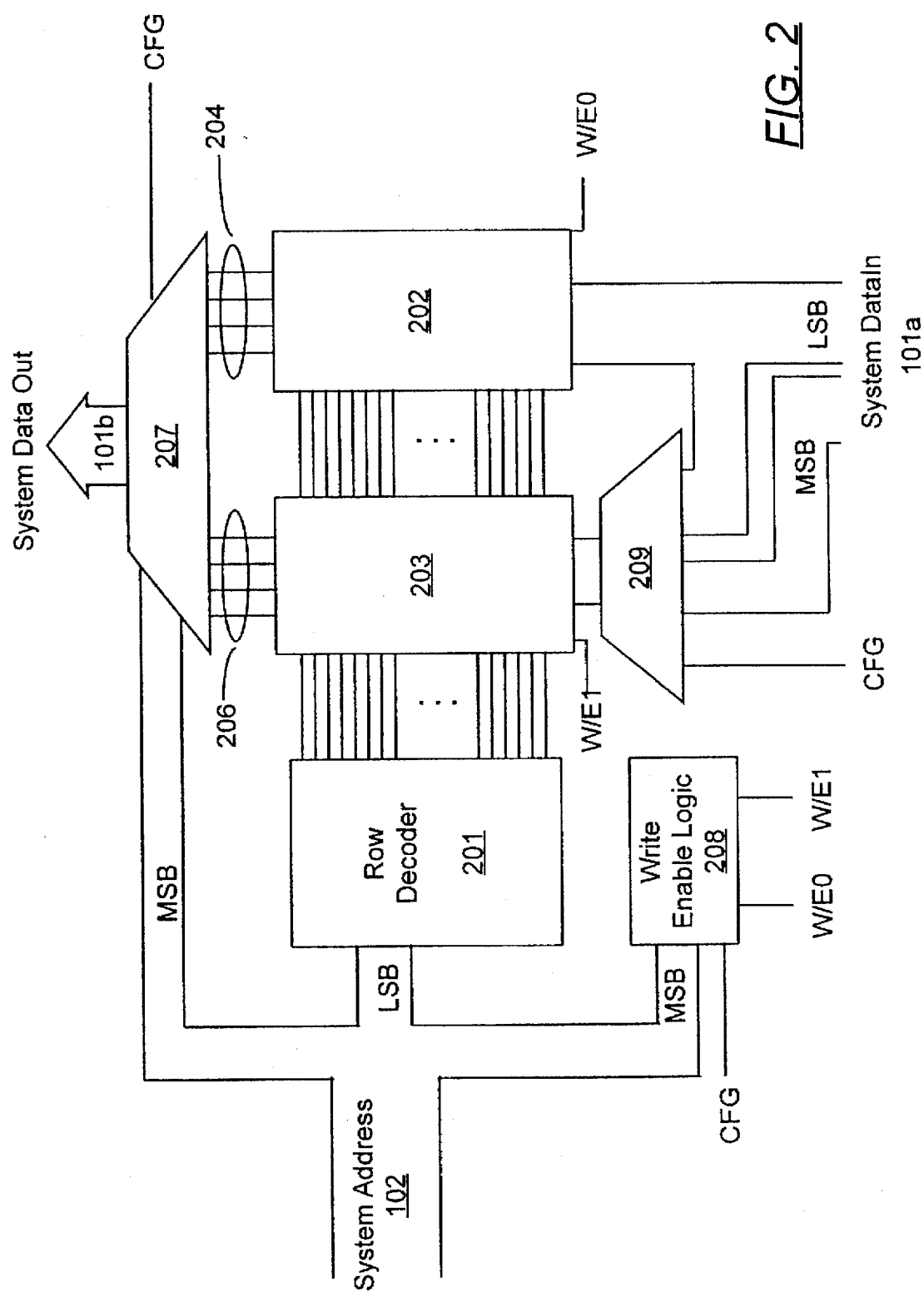
FIG. 2 shows a block diagram of a memory array of FIG. 1 in greater detail.

FIG. 2 illustrates a preferred embodiment memory array 100 that has two configurations selected by the configuration (CFG) input. In this example, memory array 100 has 2,048 memory elements or bits of storage. Memory array 100 is physically arranged as an array of 256 rows and 8 columns. Memory array 100 in this example can be configured as a logical array of 256×8 or 512×4. Hence, memory array 100 can support data transactions from an eight-bit bus or data transactions from an four-bit bus depending on the need of a particular configuration.

It should be noted that in order to support an eight-bit word, an eight-bit system data bus 101a–101b (shown in FIG. 1) must be provided. Hence, when memory array 100 is configured as an four-bit machine, four of the data bus lines are "wasted". However, it should be understood that when memory array 100 is embedded in a programmable logic device, the data lines that are "wasted" can be used for other portions of the PLD, hence, they are not actually wasted even though they are not used for memory array 100.

In the example memory array 100, the logical configuration having the most number of logical rows is a 512×4 configuration. Hence, system address bus 102 preferably has sufficient address lines to address 512 unique rows. In the specific example, system address bus 102 has nine address lines identified as a first number of least significant bit lines (LSB) with the remainder being identified as most significant bit lines (MSB). Where separate read and write address lines are used, nine read address lines and nine write address lines are provided in system address bus 102 for a total of eighteen wires.

A number of the LSB system address lines are coupled to row decoder 201 from system address bus 102. The number of LSB lines coupled is preferably sufficient to generate unique addresses for each physical row in memory array 100. In the stated example, memory array 100 has 256 physical rows hence row decoder is coupled to the 8 LSB bits of system address bus 102. Row decoder 201 generates row addresses on 256 row address lines that are coupled to memory columns 202 and 203. Where separate read and write address lines are used, row decoder 201 generates row address on 512 lines (256 read address lines and 256 write address lines).

The individual memory cells (not shown) in memory array 100 are subdivided into logical columns. In the example, a first group of cells is arranged into logical column 202 and a second group of cells is arranged in a logical column 203. While the two logical columns 202 and 203 shown in FIG. 2 allow only two logical configurations, it will be apparent that this arrangement can be expanded to provide more selectable logical configurations according to the teachings of the present invention.

Logical column 202 and logical column 203 are coupled in parallel to each of the address lines extending from row decoder 201. Hence, upon assertion of any given address line by row decoder 201 a row in logical column 202 is addressed and a row in logical column 203 is addressed. During a read operation both addressed rows are coupled to multiplexor 207 by data lines 204 and 206 as shown in FIG. 2. Multiplexor 207 is controlled by the configuration bit and by the most significant bits from system address bus 102 to present the desired output on system data out bus 101b. The details of multiplexor 207 for the specific embodiment are described herein below.

During a write operation logical column 202 is enabled by the write/enable-0 (W/E0) line. Similarly, logical column 203 is enabled by the write/enable-1 (W/E1) line. Hence, although both logical column 202 and logical column 203 are simultaneously addressed, whether data can be written to a cell or cells within logical column 202 or logical column 203 is determined by the state of the write enable lines.

Write enable lines W/E0 and W/E1 are generated by write enable logic 208. Write enable logic 208 comprises combinatorial logic accepting the most significant bits from system address 101 and the configuration bit to generate W/E0 and W/E1. Details of write enable logic 208 will be described hereafter.

System data in bus 101a is coupled to the data lines of logical column 202 and the data lines of logical column 203. In the preferred embodiment, the four least significant bits defined as LSB in FIG. 2 are coupled directly to data lines of logical column 202. Regardless of whether memory array 100 is configured as a 256×8 or 512×4 array, the four LSB bits from the system data in bus 101a will always be the appropriate wires to carry data that should be loaded into logical column 202. On the other hand, when memory array 100 is configured by a 256×8 array the four most significant bits of data in bus 101a will be loaded into logical column 203 when appropriately addressed.

When memory array 100 is configured by a 512×4 array, however, the four most significant bits of system data in bus 101a do not carry meaningful data for the memory array. In this case, the four least significant bits are coupled to the data lines of logical column 203. Multiplexor 209 serves to select either the four most significant bits or four least significant bits from system data in bus 101a in response to the configuration bit CFG. In this manner, by selection of a single configuration bit, logical array 100 shown in FIG. 2 can be configured as either a 256×8 or 512×4 logical configuration to meet the users needs.

3. Data output multiplexor and write enable logic

FIG. 3 and FIG. 4 illustrate diagrams of a preferred embodiment of system data out multiplexor 207 and write enable logic 208 in accordance with the present invention. The implementation shown in both FIG. 3 and FIG. 4 is related to the example shown of a configurable memory 100 that has two configurations. As shown in FIG. 3, a first multiplexor controlled by the configuration bit is used to select between a logic 0 and the most significant bit (in this case ADD[8] or the 9th bit). In the example shown in FIG. 3, when the configuration bit is 1 the ADD[8] signal is coupled to the output of multiplexor 301. When the configuration bit is 0, a logic 0 is coupled to the output of multiplexor 301.

The output of multiplexor 301 is coupled to the address input of multiplexor 302. Multiplexor 302 receives two sets of inputs corresponding to the data output lines 204 and 206 shown in FIG. 2. In the specific example of FIG. 2, data output lines 204 are four lines wide and data output line 206 are four lines wide coming from logic column 203. The output of multiplexor 302 is as wide as the data bus which in this case is four bits wide. The data output from logic column 203 is coupled directly to the most significant bits of system data bus 101b. When configurable memory 100 is configured to have a logical configuration of eight bits wide, data lines 206 will supply the four most significant bits. When configurable array is configured for a four bit wide word, the most significant bits of data output bus 101 are not used and hence their contents irrelevant.

When the configuration bit is 1, the 512×4 configuration is selected. In this case, when the most significant address bit ADD[8] is 1, the data bits from data lines 206 are coupled to the least significant bits of system data output bus 101b.

When ADD[8] is 0, the data bits from data aligns 204 are coupled to the least significant bits of system data output bus 101b. In this manner, system data output bus 101b contains either the appropriate 4-bit word in the 512×4 configuration or the appropriate eight-bit word in the 256×8 configuration.

FIG. 4 illustrates a preferred method of generating the write enable signals W/E0 and W/E1 from the single write enable provided to configurable memory array 100 together with the configuration (CFG) and address bits. Upper multiplexor 401 receives as address bits the most significant address bit, in this case ADD[8], and the configuration bit. For data inputs, the write enable (W/E) signal is applied as well as a "hard disable" signal. The "hard disable" signal is a fixed voltage that will cause the logical column to which it is applied to be disabled from writing. For example, when an active low write enable signal is used, the hard disable will be a logic 1 or tied to the high voltage supply. In contrast when an active high write enable signal is used, hard disable line is provided by coupling the line to ground.

Upper multiplexor 401 is configured such that when the configuration bit is 0 the write enable signal is coupled to W/E0 regardless of the contents of the most significant address bit ADD[8]. When the configuration bit is 1 the W/E signal is coupled to W/E0 when ADD[8] is 0. This serves to enable logic column 202 when the most significant address bit is 0. When the most significant address bit is 1, logic column 202 is disabled.

Lower multiplexor 402 functions in a similar manner and is addressed by the configuration bit CFG and ADD[8]. Like upper multiplexor 401, when the configuration bit is 0 (i.e. 256 by 8 configuration) regardless of the upper address bit ADD[8] the W/E signal is coupled to W/E1. This is because when the configuration bit is set to cause the wide word configuration (i.e., 256×8) both logical column 203 and logical column 202 must be enabled. Unlike upper multiplexor 401, lower multiplexor 402 passes the hard disable to the W/E1 output when ADD[8] is logic low. When ADD[8] is logic high, the W/E signal is coupled to the W/E1 output. In this manner, either logic column 202, logic column 203, or both logic column 202 and 203 are selected for writing at appropriate times according to the most significant address bit and the configuration bit.

The circuitry shown in FIG. 3 and FIG. 4 is exemplary only and it will be understood that that logical equivalents can easily be derived by those with skill in the art. For example, rather than multiplexors the circuits could be implemented in primitive AND/OR gates and the like. Similar circuitry can be developed for any size data bus, and would follow the teachings of the present invention. Further, the example shown uses only two selectable configurations, however, any number of selectable configurations can be provided in a similar manner using multiplexors to combine data from a plurality of logical columns.

4. Dual read/write structure

Figure 5:
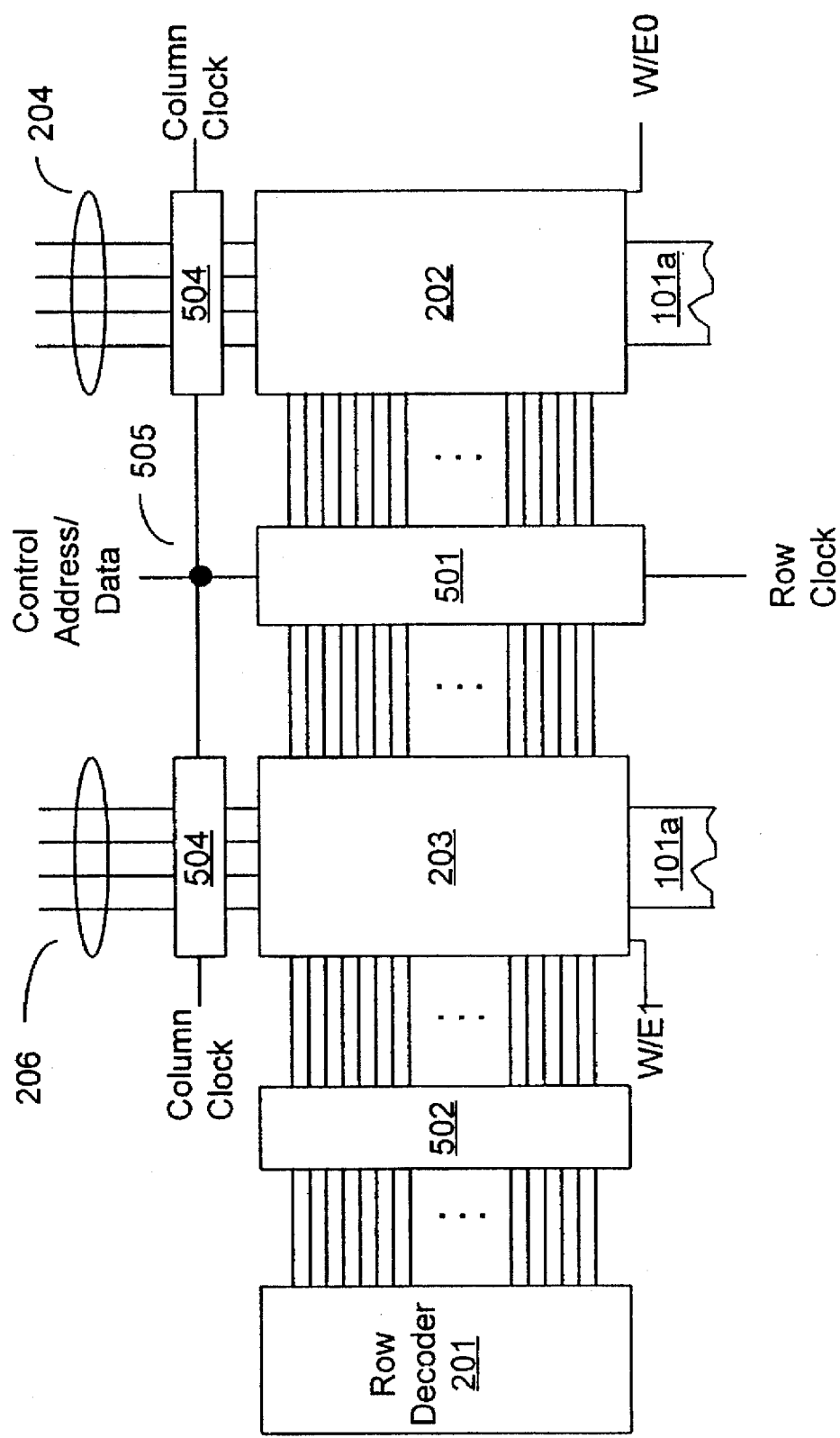
FIG. 5 illustrates a preferred memory array having dual address and data ports.
Figure 6:
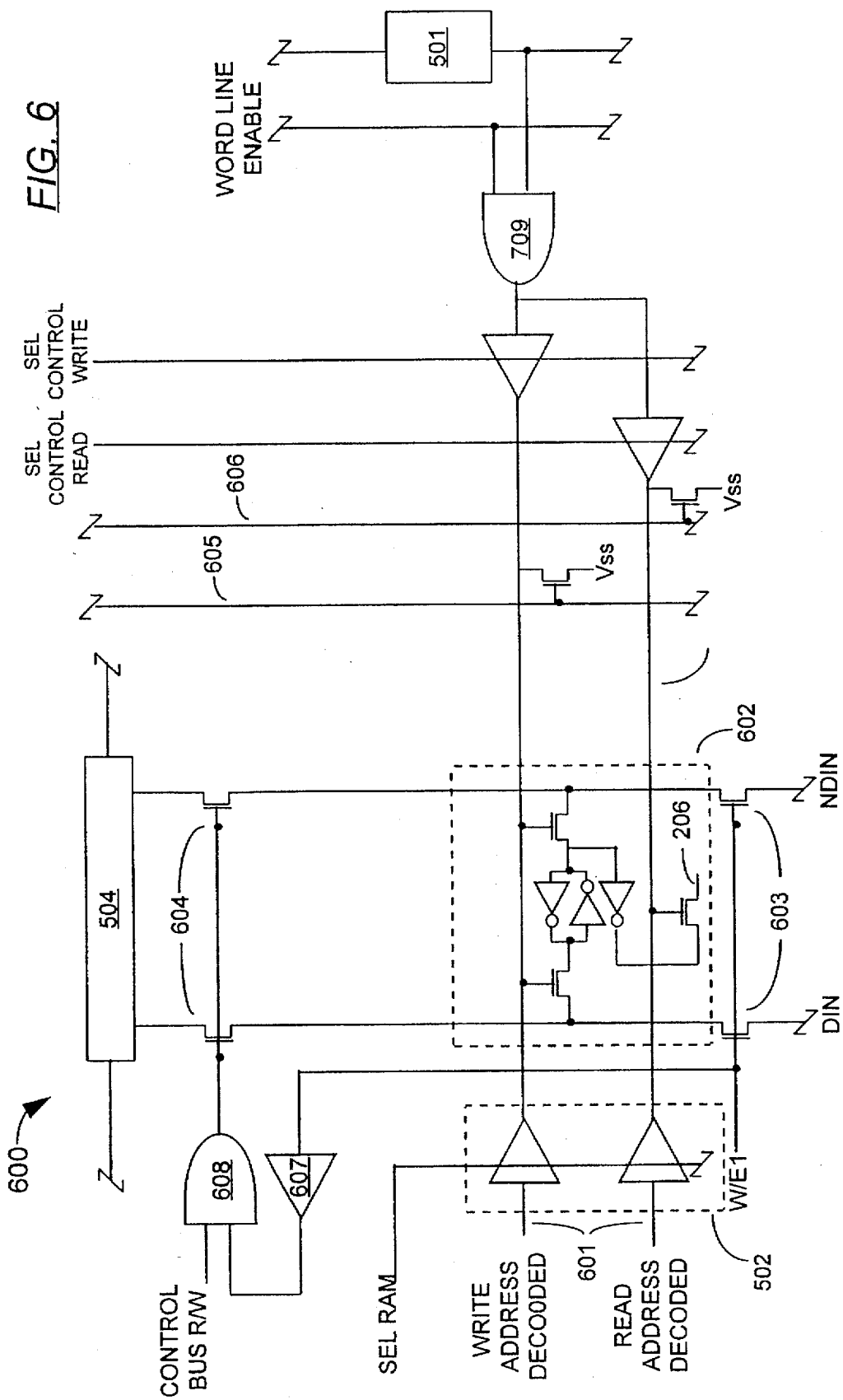
FIG. 6 shows a logic diagram of a preferred storage cell useful in the array shown in FIG. 5.

FIG. 5 and FIG. 6 illustrate components of a preferred embodiment in which RAM 100 has a secondary or "back door" data path allowing data to be written to and read from memory array 100 without using system address bus 102 or system data bus 101a–101b. In FIG. 5 the components that are labeled to match elements shown in earlier figures are intended to be the same elements earlier described and function in a similar manner. Accordingly, these elements will not be described in great detail with reference to FIG. 5 and FIG. 6.

As shown in FIG. 5, a row register 501 is coupled to each address line of logical columns 202 and 203. Row register 501 is preferably implemented as a shift register having the same length as the number of row address lines. Hence, shift register 501 preferably has the same number of rows as the physical number of rows in logical column 203 and logical column 202. Row register 501 receives a row clock and a serial data input from the control address/data line and shifts data through row register 501 on each clock pulse of the row clock. In this manner, row register 501 can be used to apply data directly to row address lines bypassing row decoder 201.

Preferably, buffer 502 is provided to prevent signals asserted by row register 501 from affecting row decoder 201 or system address bus 102 connected to row decoder 201. This protects system address bus 102 from changes while addresses are applied through row register 501.

Control address/data line 505 is also coupled to column registers 504. Column registers 504 have the same width as the width of each logical column 202 and 203. Logical columns 504 may be implemented as a single shift register rather than two shift registers as shown. The two shift register implementation is shown merely for ease of illustration and understanding. Data from serial control address/data line 505 is clocked through register 504 upon receipt of the column clock. Column registers 504 are coupled to each of data lines 204 and 206 from the system data out bus 101b.

In operation, column registers 504 are used to capture data from an addressed row in logical column 202 or 203. This capture is initiated by control lines (not shown). Once captured, the column clock is pulsed to shift the captured data serially out through serial control address/data line 505 for analysis by external equipment. Optionally, data can also be shifted into logical columns 202 and 203 by reversing the above described process applying serial data through serial address/control line 505 into column registers 504. Data can then be loaded from column registers 504 into logical columns 202 or 203 upon receipt of an address signal from row register 501.

FIG. 6 illustrates a circuit diagram of a single bit of RAM making up one storage location 600 in logical column 203. Decoded address lines 601 extend from row decoder 201 (shown in FIG. 2) to each storage element. In the specific example shown in FIG. 6, one decoded write address 601 and one decoded read address 601 are provided. Storage circuit 602 comprises a number of gates and switches to form a conventional SRAM cell in FIG. 6. Any known storage circuit can be provided as an equivalent to the specific circuit shown as storage circuit 602.

Storage circuit 602 receives data input lines (DIN and NDIN) from system data in bus 101a. In the example shown in FIG. 6, differential inputs are used for each storage cell 602. Hence, DIN and NDIN are logical opposites to enable the differential circuitry. Transistors 603 receive a gate control signal from the W/E1 line so as to couple the data from system data in bus 101a to storage circuit 602 upon receipt of the W/E1 signal. Data stored in storage circuit 602 is coupled to output line 206.

Buffer 502 comprises a plurality of buffers each activated by a control signal from the SEL RAM line. Assertion of a signal on the SEL RAM line indicates that storage circuit 602 is to write data from or read data to the system data bus 101a–101b (shown in FIG. 1). When SEL RAM is not asserted, the decoded address lines, hence row decoder 201 (shown in FIG. 2) are electrically isolated from storage circuit 602).

When logical column 203 is selected (i.e., W/E1 asserted), SEL RAM asserted, and the decoded write address line is asserted, data currently appearing on the DIN and NDIN lines of system data bus 101a is stored in storage circuit 602. Similarly, when logical column 203 is selected (i.e., W/E1 asserted), SEL RAM asserted, and the decoded read address line is asserted, data currently stored in storage circuit 602 is coupled to data output lines 206.

Write pull down line 605 and read pull down line 606 are provided to remove charge from storage circuit 602. Charge removal is particularly important when buffers 502 are used as the read and write address lines entering storage circuit 602 are left "floating" when the SEL RAM line is de-asserted.

Data inputs to storage element 602 are also coupled to one bit of data register 504 through pass transistor 604. Transistors 604 receive a signal from a control bus read/write (R/W) line through gate 608. Assertion of the control bus R/W line indicates that data is to be coupled to data register 504 rather than the system data lines 206. Gate 608 also receives an inverted W/E 1 signal from gate 607 that ensures that if the W/E 1 line is asserted (i.e., logical column 203 selected), that the scan path is disabled by transistors 604. Hence, gates 607 and 608 serve together to prevent data stored in data register 504 from being coupled to system data bus 101a.

In operation, when W/E 1 is inactive and the control bus R/W line is asserted, data register 504 can read data from or write data to storage circuit 602 depending on the state of SEL CONTROL WRITE or the SEL CONTROL READ lines. Buffer 502 prevents the SEL CONTROL WRITE or the SEL CONTROL READ lines from affecting system address bus 102. Similarly, transistors 603 prevent data from changing on system data input bus 101a during a read to or write from control data register 504. In this manner, storage element 600 in accordance with the present invention selectively couples data to either the system data bus 101a–101b or to control data register 504.

The serial address/data bus implemented by control data register 504 and control address register 501 will be much slower than the parallel system data bus 101a–101b and address bus 102. It is contemplated that the serial control address/data bus 505 will be used primarily for evaluation and testing configurable array 100 (shown in FIG. 1) rather than real-time data processing. Also, serial control address/data bus 505 can be used to preload or program information into memory array 100 prior to real-time operation.

It should be appreciated that a configurable storage element particularly for use in programmable logic devices (PLDs) is provided. Specifically, a configurable random access memory block for field programmable logic devices is provided. The present invention allows a user to select the logical configuration of the logic block. The present invention also allows a user to halt operation of the PLD and access data stored in the configurable RAM without disturbing system resources such as system address lines and system data lines. It is to be expressly understood that the claimed invention is not to be limited to the description of the preferred embodiment or the specific examples shown herein, but encompasses other modifications and alterations within the scope and spirit of the inventive concept.

We claim:

1. A random access memory (RAM) array comprising: an array of storage elements;
   a line for receiving a configuration signal; and
   a logical configuration circuit responsive to the configuration signal for providing a first logical configuration having r rows of w-bit data words while the configuration signal is in a first state and providing a second logical configuration having x rows of y-bit data words while the configuration signal is in a second state;

wherein the array of storage elements includes a first logical column of r rows of y-bit words and a second logical column of r rows of y-bit words;

a first write enable line coupling the logical configuration circuit to the first logical column, wherein data can only be stored in storage elements of the first logical column upon assertion of the first write enable line; and a second write enable line coupling the logical configuration circuit to the second logical column, wherein data can only be stored in storage elements of the second logical column upon assertion of the second write enable line.

2. A random access memory (RAM) array comprising: an array of storage elements;

a line for receiving a configuration signal; and a logical configuration circuit responsive to the configuration signal for providing a first logical configuration having r rows of w-bit data words while the configuration signal is in a first state and providing a second logical configuration having x rows of y-bit data words while the configuration signal is in a second state, an address bus carrying an externally generated multi-bit address signal, the multi-bit address signal including a least significant bit (LSB) portion and a most significant bit (MSB) portion;

an address decoder receiving the LSB portion of the address bus and generating a plurality of decoded address signals;

a plurality of address lines coupling the decoded address signals to the array of storage elements; and a plurality of write/enable lines coupling the logical configuration circuit to the array of storage elements, wherein the logical configuration circuit is responsive to the MSB portion of the multi-bit address signal in combination with the configuration signal, the storage elements being responsive to the address lines and the plurality of write/enable lines to enable writing operations.

3. The random access memory of claim 3 wherein the address bus includes a read address portion and a write address portion and the address decoder further comprises:

a read address decoder portion receiving the LSB portion of the read portion of the address bus and generating a plurality of decoded address signals; and a write address decoder receiving the LSB portion of the write portion of the address bus and generating a plurality of decoded address signals.

4. A random access memory comprising:

a plurality of logical columns each storing r-rows of plural-bit data words, wherein each logical column is capable of being enabled independently of others of the plurality of logical columns;

a system address bus carrying an externally generated multi-bit address signal, the multi-bit address signal including a least significant bit (LSB) portion and a most significant bit (MSB) portion;

an address decoder receiving the LSB portion of the system address bus and generating a plurality of decoded address signals;

a plurality of address lines coupling one of the decoded address signals to each of the r-rows of each of the plurality of logical columns; and a logical configuration circuit receiving a user supplied configuration signal and receiving the MSB portion of the system address bus, the logical configuration circuit providing a plurality of independent enable signals to each of the plurality of logical columns.

5. The random access memory of claim 4 further comprising:

a data output multiplexor receiving a stored data word from each logical column and outputting a data word on a system data output bus, the data output multiplexor controlled by the MSB portion of the multi-bit address signal and the user supplied configuration signal to place selected ones of the stored data words onto the system data output bus.

6. The random access memory of claim 4 wherein the address bus includes a read address portion and a write address portion and the address decoder further comprises:

a read address decoder portion receiving the LSB portion of the read portion of the address bus and generating a plurality of decoded address signals; and a write address decoder receiving the LSB portion of the write portion of the address bus and generating a plurality of decoded address signals.

7. The RAM of claim 6 further comprising:

a system data input bus for carrying groups of plural-bit data words; and a multiplexor receiving each of the plural-bit data words from the system data input bus and coupling a selected one of the plural-bit data words to one of the plurality of logical columns, wherein the selected plural-bit data word is determined by the user supplied configuration signal.

8. The RAM of claim 7 further comprising:

a switching circuit for controllably coupling the selected plural-bit data word to one of the plurality of logical columns wherein the switching circuit is controlled by one of the plurality of independent enable signals.

9. The RAM of claim 4 further comprising:

a system data input bus carrying a plural-bit data word;

a control address bus operating independently of the system address bus, the control address bus carrying an r-bit address signal; and a control data bus operating independently of the system data input bus, the control data bus coupled to each of the plurality of logical columns to simultaneously receive each of the plural-bit data words from the plurality of logical columns.

10. A random access memory (RAM) comprising:

a number of rows of plural-bit storage registers;

an address decoder coupled to a system address bus and to provide a system address signal to each of the number of rows;

a system data bus for data communication with the plural-bit storage registers;

a control address register coupled to a control address bus and to provide a control address signal to each of the number of rows;

a control data register for data communications with the plural bit storage registers;

an address buffer for electrically isolating the system address bus from the control address signals; and a switching circuit responsive to an externally supplied system enable signal for coupling only one of the control data register and the system data bus to the plural-bit storage registers.

11. The RAM of claim 10 wherein: the system data bus comprises a plurality of parallel wires, each wire for communicating with one bit of the plural-bit storage registers; and the control data register comprises a plural-bit shift register having a serial I/O and a parallel I/O and each bit of the plural-bit shift register is coupled to one bit of the plural-bit storage registers through the parallel I/O.

12. The RAM of claim 10 further comprising:

a row decoder receiving the system address bus and generating at least one row address signal to each of the plurality of rows, wherein the system address bus comprises a plurality of parallel wires; and the control data register comprises a plural-bit shift register having a serial I/O and a parallel I/O and each bit of the plural-bit shift register is coupled to one of the number of rows through the parallel I/O.

* * * * *